(12) United States Patent
Miyazawa

(10) Patent No.: US 7,869,223 B2
(45) Date of Patent: Jan. 11, 2011

(54) CIRCUIT BOARD DEVICE FOR INFORMATION APPARATUS, MULTILAYERED MODULE BOARD AND NAVIGATION SYSTEM

(75) Inventor: Hirohisa Miyazawa, Zama (JP)

(73) Assignee: Xanavi Informatics Corporation, Zama-shi (JP)

( * ) Notice: Subject to any disclaimer, the term of this patent is extended or adjusted under 35 U.S.C. 154(b) by 1373 days.

(21) Appl. No.: 10/510,567

(22) PCT Filed: Apr. 9, 2003

(86) PCT No.: PCT/JP03/04489

§ 371 (c)(1), (2), (4) Date: Oct. 8, 2004

(87) PCT Pub. No.: WO03/086035

PCT Pub. Date: Oct. 16, 2003

(65) Prior Publication Data

US 2005/0156306 A1 Jul. 21, 2005

(30) Foreign Application Priority Data

Apr. 9, 2002 (JP) ............................. 2002-106513

(51) Int. Cl.
*H01R 12/16* (2006.01)
(52) U.S. Cl. ..................... 361/790; 361/785; 361/803
(58) Field of Classification Search ............. 701/50–51; 361/760–764, 790–795
See application file for complete search history.

(56) References Cited

U.S. PATENT DOCUMENTS

| | | | | |
|---|---|---|---|---|
| 5,025,306 A | * | 6/1991 | Johnson et al. | 257/700 |
| 5,319,243 A | * | 6/1994 | Leicht et al. | 257/692 |
| 5,346,402 A | * | 9/1994 | Yasuho et al. | 439/71 |
| 5,558,540 A | | 9/1996 | Kato et al. | |
| 5,610,801 A | * | 3/1997 | Begis | 361/784 |
| 5,740,527 A | | 4/1998 | Mitama | |
| 5,764,491 A | | 6/1998 | Tran | |
| 5,825,630 A | * | 10/1998 | Taylor et al. | 361/790 |
| 5,914,693 A | | 6/1999 | Takei et al. | |
| 6,085,137 A | * | 7/2000 | Aruga et al. | 701/51 |
| 6,169,552 B1 | | 1/2001 | Endo et al. | |
| 6,303,989 B1 | * | 10/2001 | Yasuho et al. | 257/706 |
| 6,335,866 B1 | | 1/2002 | Ohtaki et al. | |

(Continued)

FOREIGN PATENT DOCUMENTS

EP 1 128 162 A2 8/2001

(Continued)

OTHER PUBLICATIONS

European Search Report dated Mar. 10, 2010 (Three (3) pages).

*Primary Examiner*—Tuan T Dinh
(74) *Attorney, Agent, or Firm*—Crowell & Moring LLP

(57) ABSTRACT

A multilayered module board with mounted high-frequency electronic components such as a CPU and a graphic circuit is mounted on one face of a base board with mounted low-frequency electronic components. The multilayered module board is a squared multilayered board smaller than the base board. The electronic components are wired with an inner layer-wiring pattern. Connector terminals are solder-jointed to four sides of the multilayered module board. The multilayered module board is mounted to the base board via the connector terminal.

6 Claims, 10 Drawing Sheets

U.S. PATENT DOCUMENTS

| | | | |
|---|---|---|---|
| 6,477,593 B1 * | 11/2002 | Khosrowpour et al. | 710/100 |
| 6,662,104 B2 * | 12/2003 | Ito et al. | 701/207 |
| 2002/0000901 A1 | 1/2002 | Kuhara et al. | |

FOREIGN PATENT DOCUMENTS

| | | |
|---|---|---|
| JP | 06-006027 | 1/1984 |
| JP | 62-94670 | 6/1987 |
| JP | 1-220498 A | 9/1989 |
| JP | 4-86979 | 8/1992 |
| JP | 06-006027 | 1/1994 |
| JP | 06-204642 | 7/1994 |
| JP | 06-244522 | 9/1994 |
| JP | 7-201401 A | 8/1995 |
| JP | 09-046015 | 2/1997 |
| JP | 11-119862 | 4/1999 |
| JP | 2001-135904 A | 5/2001 |
| JP | 2001-196792 | 7/2001 |
| JP | 2002-530634 | 9/2002 |

* cited by examiner

CIRCUIT BOARD DEVICE FOR INFORMATION APPARATUS, MULTILAYERED MODULE BOARD AND NAVIGATION SYSTEM

INCORPORATION BY REFERENCE

The disclosure of the following priority application is herein incorporated by reference:
Japanese Patent Application No. 2002-106513

TECHNICAL FIELD

The present invention relates to a circuit board structure in an information apparatus ideal in applications such as an on-vehicle information terminal having a navigation function.

BACKGROUND ART

There are on-vehicle information terminals in the known art, that have navigation functions including a function for displaying a road map of an area around the current vehicle position, a function for determining a recommended route from a start point to a destination through arithmetic operation and a function for providing route guidance based upon the recommended route determined through the arithmetic operation.

Such an on-vehicle information terminal includes a navigation circuit board. The navigation circuit board is achieved by mounting on a single multilayer printed board a plurality of low-frequency electronic components such as a power circuit, a gyro, a GPS circuit and a plurality of high-frequency electronic components such as a CPU chip, a memory chip and a graphics chip.

Since the navigation specifications vary among different vehicle models, the navigation circuit board is designed and manufactured in conformance to each set of specifications in the related art. This means a great length of time must be spent in the design stage to result in high production costs, and it is naturally more desirable to use fewer types of more versatile navigation circuit boards. Such a need is not unique to navigation circuit boards, but it is a common concern pertaining to all types of information terminals including on-vehicle information terminals, in which a given function needs to be altered for different models.

The present invention provides a circuit board structure to be adopted in an information apparatus that eliminates the need to design and manufacture the circuit board from scratch for each set of specifications.

DISCLOSURE OF THE INVENTION

The circuit board device for an information apparatus according to the present invention comprises a base board having a plurality of electronic components mounted thereupon and a multilayer module board mounted at one surface of the base board and having mounted thereupon a plurality of electronic components including at least a CPU and a memory. The multilayer module board is a multilayered board smaller in size than the base board, and the plurality of electronic components are wired through a wiring pattern at an inner layer of the multilayer board.

The multilayer module board may be connected to the base board by soldering a connector terminal provided at a peripheral edge thereof onto a junction portion formed on the base board.

It is desirable to mount an electronic component at another surface of the multilayer module board by utilizing a space formed by the connector terminal between the multilayer module board and the base board in addition to the electronic components mounted at one surface of the multilayer module board.

It is desirable to mount low-frequency electronic components at the base board and mount high-frequency electronic components at the multilayer module board.

The high-frequency electronic circuits include at least a graphics circuit as well as the CPU and the memory. In addition, the low-frequency electronic circuits include at least a power circuit, a gyro and a GPS circuit. The circuit board device described above may be adopted in a navigation system.

At the multilayer module board according to the present invention, a plurality of high-frequency electronic components including the CPU and the memory are mounted at, at least, a surface thereof on one side, and the plurality of high-frequency electronic components are connected with one another through a wiring pattern formed at an inner layer. The overall shape of this module board may be rectangular. Connector terminals provided as separate members may each be connected through soldering onto one of the four peripheral edges of the board. The four connector terminals at such a multilayer module board each include a narrow elongated base portion constituted of resin and a plurality of pins fixed to the base portion and the four connector terminals are carried with the base portions mounted at a transfer adapter and are connected through soldering onto the rear surface of the board while attached to the transfer adapter.

The multilayer module board may adopt the structure described below. The four connector terminals may each include a narrow, elongated base portion constituted of resin, a plurality of pins fixed to the base portion, aligning pins projecting at both ends of the base portion to be used when soldering the connector terminal onto the rear surface of the board, and inclined surfaces for position control formed at both ends of the base portion to be used when soldering the connector terminal. At each of the four corners of the board, a pair of positioning holes at which the aligning pins can be loosely fitted may be formed. This structure allows the position control inclined surfaces of adjacent connector terminals to come into contact with each other in a state in which the aligning pins are loosely fitted at the positioning holes, and thus, it becomes possible to control the positions of the connector terminals when connecting them to the board through soldering.

The circuit board for the navigation system according to the present invention adopts the following structure. Module boards include, at least, a high-speed module board, an advanced function module board, a low-end module board and a multimedia module board having a non-navigation function that allows various types of data such as music and images to be reproduced as well as a navigation function. A single common base board can be used in conjunction with a plurality of module boards and the circuit board is manufactured by mounting one module board selected from the plurality of module boards at the base board.

The high-speed module board is a circuit board for a high-grade navigation system that operates at higher speed rather than a navigation system conforming to low-end specifications. The advanced function module board is a circuit board for a high-grade navigation system having more functions than a navigation system conforming to low-end specifications. The low-end module board is a circuit board for a less expensive navigation system conforming to lower end specifications rather than the high-grade navigation system.

According to the present invention described above, the need to design and manufacture a circuit board for each set of specifications from scratch is eliminated and thus, the length of time to be spent in the development stage is reduced to achieve a cost reduction.

BEST MODE FOR CARRYING OUT THE INVENTION

Figure 1:
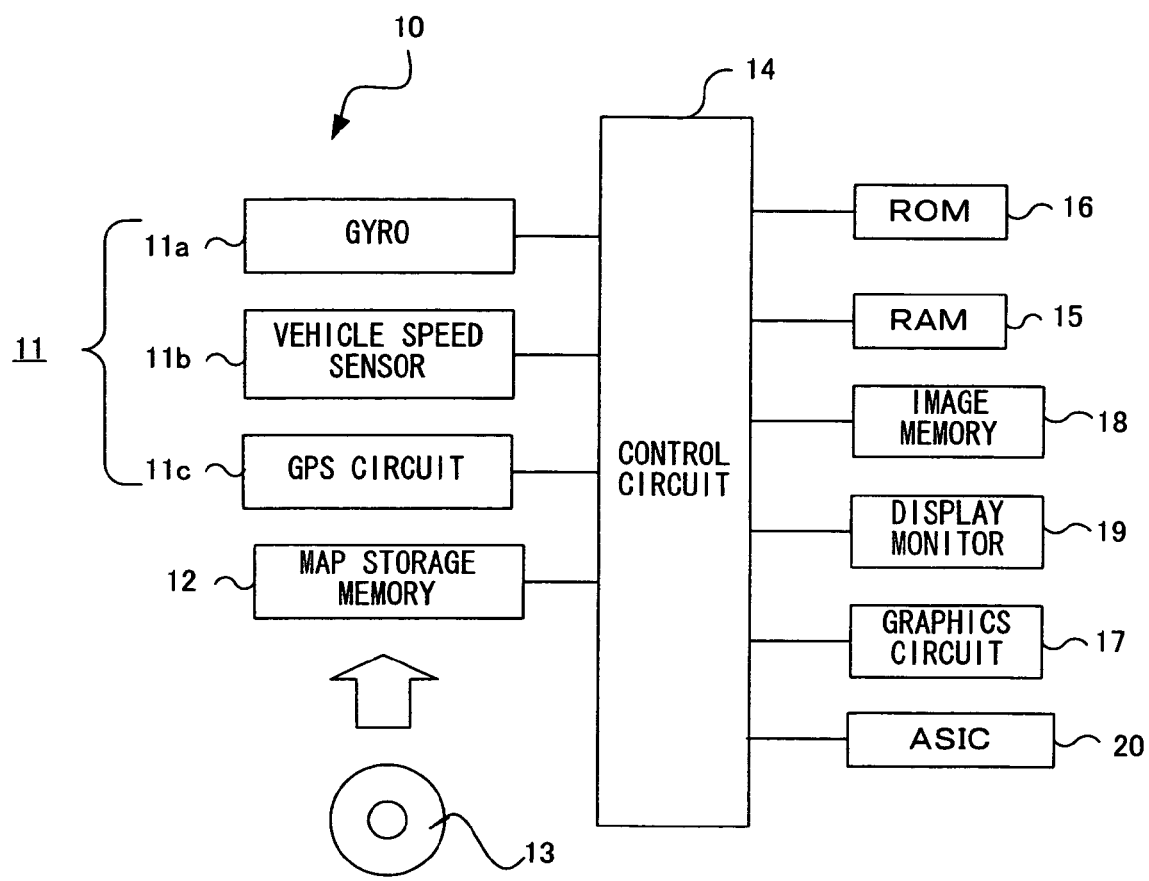
FIG. 1 is a system block diagram presenting an example of a navigation system in which the circuit board device for an information apparatus according to the present invention may be adopted.

FIG. 1 is a system block diagram of a navigation system 10 achieved in an embodiment of the present invention. The navigation system 10 has functions for providing information related to vehicle travel. More specifically, it has a function for displaying a road map of an area around the current vehicle position, a function for calculating a recommended route from the start point (the current position) to a destination (an end point) through arithmetic operation, a function for providing route guidance based upon the calculated recommended route and the like. In short, it is an apparatus that provides so-called navigation or route guidance.

Reference numeral 11 in FIG. 1 indicates a current position detection device that detects the current position of the vehicle, which may include, for instance, a gyro 11a that detects the advancing direction of the vehicle, a vehicle speed sensor 11b that detects the vehicle speed and a GPS circuit 11c that detects a GPS signal provided from a GPS satellite. Reference numeral 12 indicates a map storage memory in which road map data, address data and the like readout by a read device from a recording medium such as a CD-ROM 13 or a DVD are stored as needed.

Reference numeral 14 indicates a control circuit that controls the overall system and comprises a microprocessor and its peripheral circuits. The control circuit 14 uses a RAM 15 as a work area where it implements various types of control to be detailed later by executing a control program stored in a ROM 16. Reference numeral 17 indicates a graphics circuit that executes, for instance, drawing processing when displaying a planimetric map, a stereoscopic map (a birds-eye-view map) or the like at a monitor 19.

Reference numeral 18 indicates an image memory in which image data to be displayed at the display monitor 19 are stored. The image data, which include road map drawing data and various types of graphics data, are prepared at the graphics circuit 17. The image data stored in the image memory 18 are read out as needed and are displayed at the display monitor 19. Reference numeral 20 indicates an ASIC that executes processing such as a route search calculation.

The navigation system 10 adopting the structure described above executes a route search by designating the subject vehicle position detected by the current position detection device 11 as the start point and designating the destination set by the operator as the end point. The route search is executed by adopting a method of the known art based upon the road map data stored in the CD-ROM 13 or the map storage memory 12. The route resulting from the search is displayed with a bold line on the display monitor 19 and the vehicle is guided to the destination by providing audio guidance whenever the vehicle approaches a right or left turn point.

Figure 2:
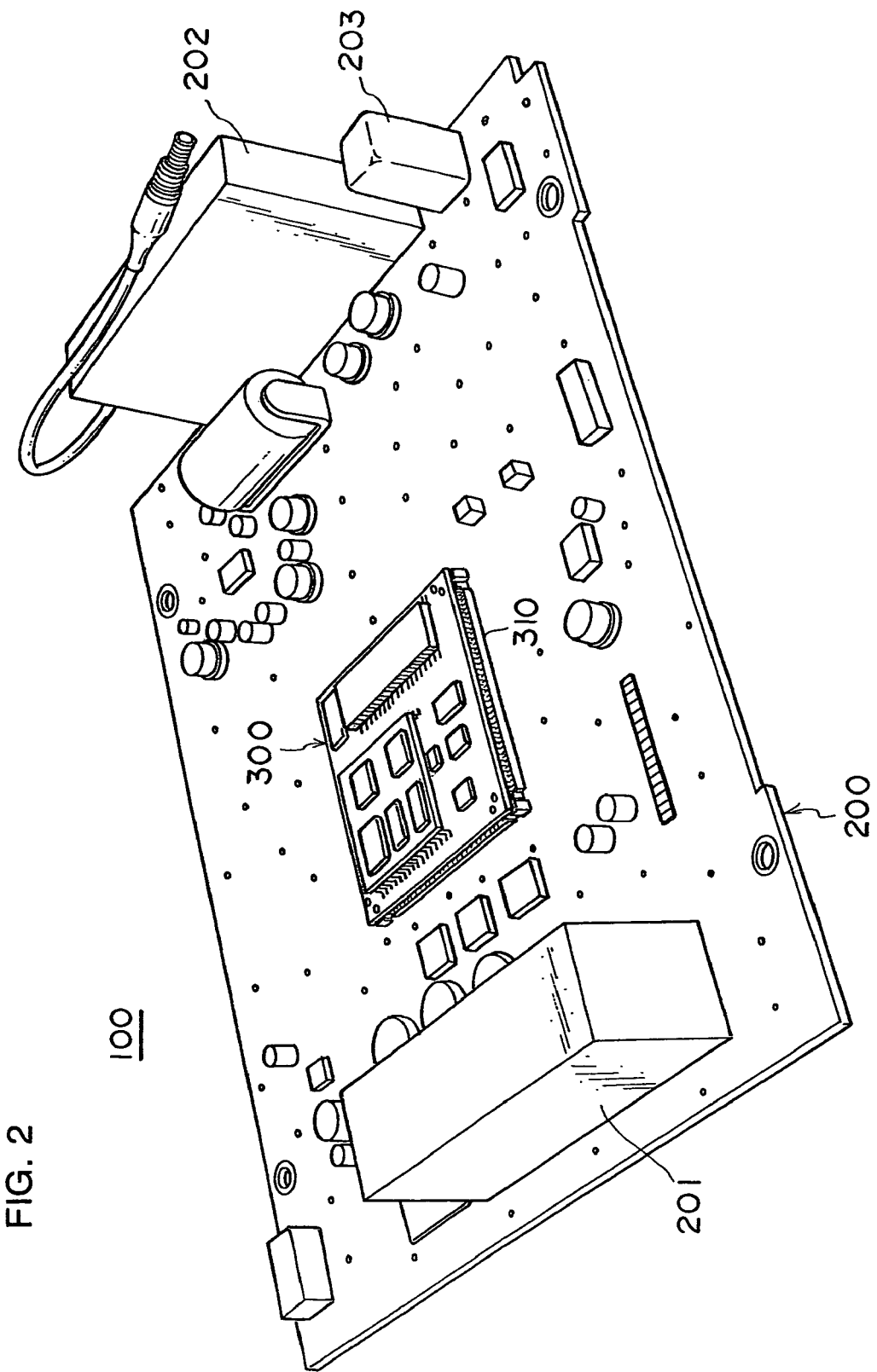
FIG. 2 is a perspective of the circuit board device for an information apparatus achieved in an embodiment of the present invention.
Figure 3:
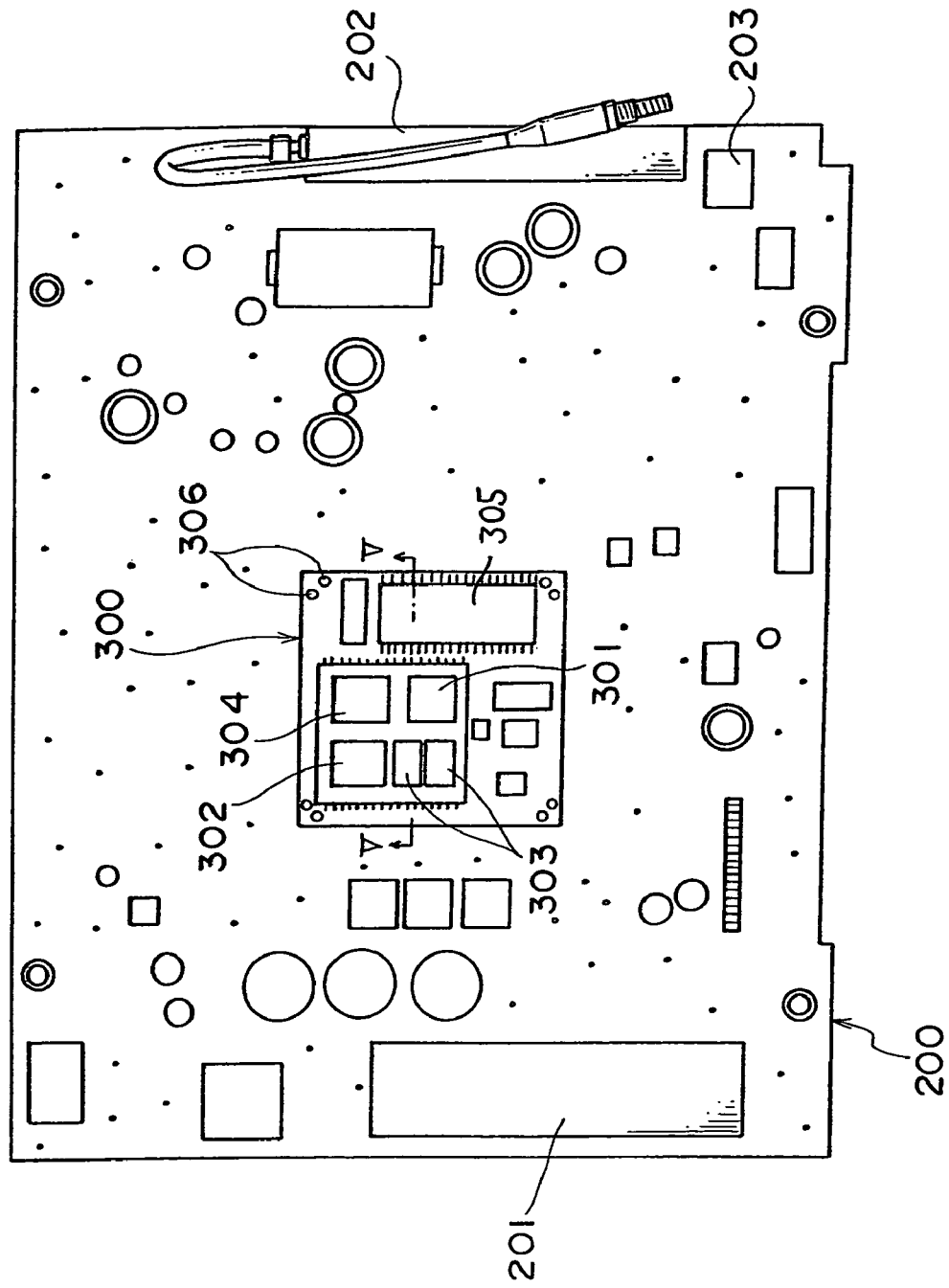
FIG. 3 shows the front surface of the circuit board device in FIG. 2.
Figure 4:
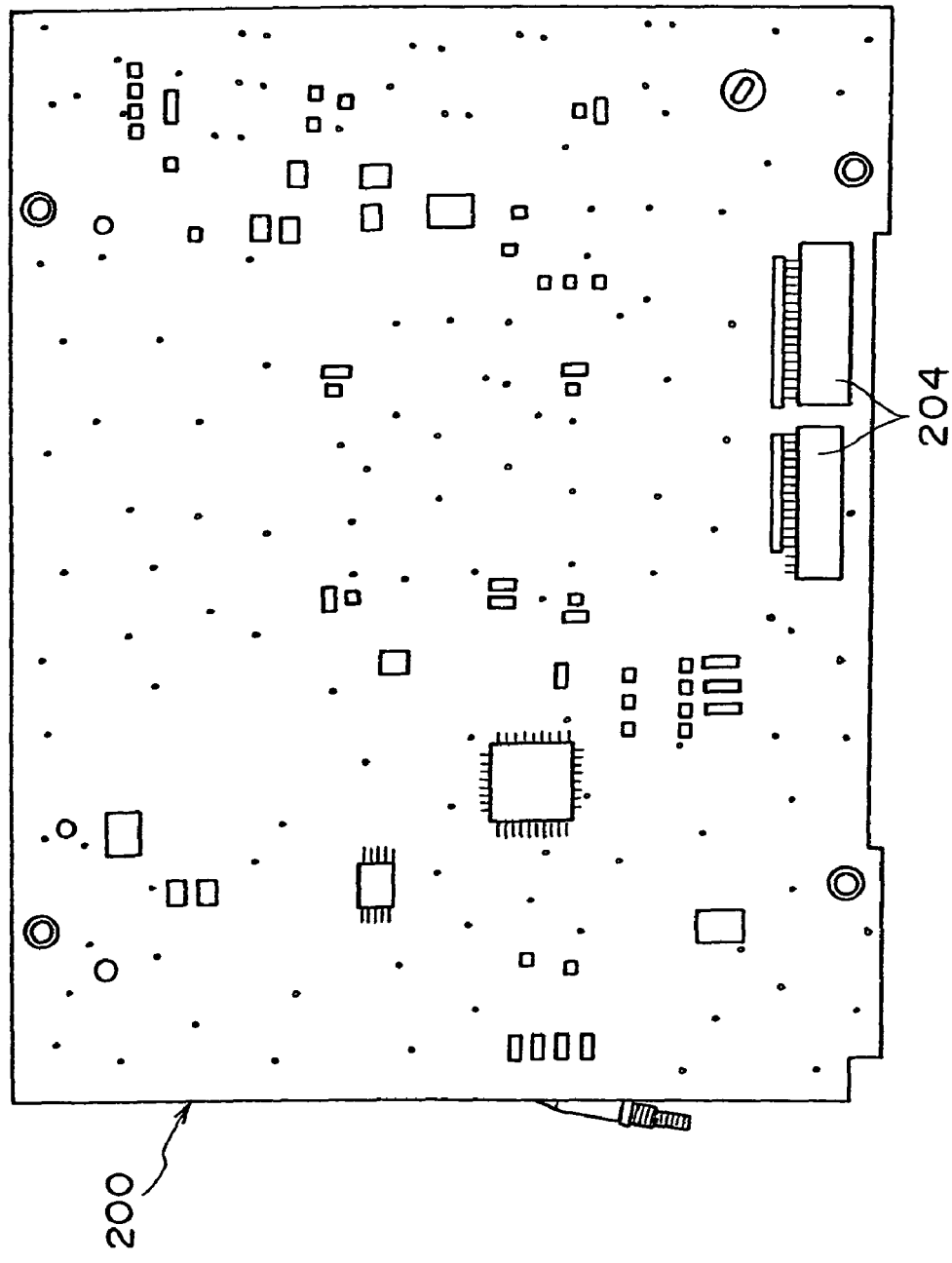
FIG. 4 shows the rear surface of the circuit board device in FIG. 2.

FIG. 2 is a perspective of a circuit board device 100 of the navigation system 10, FIG. 3 shows the circuit board device 100 viewed from the front and FIG. 4 shows the circuit board device 100 viewed from the rear. The circuit board device 100 includes a multilayer base board 200 having a plurality of electronic components mounted thereupon and a multilayer module board 300 mounted at the base board 200 and having mounted thereupon a plurality of electronic components including at least a CPU and a memory. The multilayer module board 300 is connected to the base board 200 by soldering connector terminals 310 disposed at peripheral edges thereof to junction portions formed at the base board 200.

A plurality of wiring pattern layers are formed in the base board 200, and a power device 201, a GPS circuit 202, a gyro 203 and other electronic components are mounted at the top layer (the front surface) of the base board 200. At the bottom layer (the rear surface) of the base board 200, connector devices 204 and other electronic components are mounted. The electronic components mounted at the base board 200 are all low-frequency components connected with one another through the wiring patterns formed at inner wiring pattern layers. It is to be noted that while electronic components having operating frequencies equal to or lower than 40 MHz are defined as the low-frequency electronic components in the explanation of the embodiment, low-frequency electronic components may operate at other operating frequencies.

The multilayer module board 300 assuming a square shape includes a plurality of wiring pattern layers. A plurality of high-frequency electronic components such as a CPU 301, an ASIC 302, a memory 303, a graphics circuit 304 and a flash memory 305 are mounted at the top layer (the front surface) of the multilayer module board 300. In this embodiment, the CPU 301, the ASIC 302, the memory 303, the graphics circuit 304 and like with operating frequencies equal to or higher than 200 MHz are provided in a so-called multi-chip module. These high-speed elements are connected with one another through a wiring pattern formed at an inner layer of the multi-chip module. The operating frequencies of elements that are not part of the multi-chip module, such as the flash memory 305, are equal to or higher than 100 MHz and equal to or lower than 200 MHz, and these elements are connected with one another at an inner pattern layer in the multilayer module 300. It is to be noted that the high-frequency electronic components may operate at operating frequencies other than those mentioned above.

By wiring the high-frequency electronic components at the inner pattern layers in the multi-chip module and the multilayer module board 300, the length of the wiring required to connect the high-frequency electronic components can be reduced compared to the length of wiring that would be required to connect them all at the front surface of the multilayer module board 300, which will approve effective when adopted in conjunction with EMI. It is to be noted that while electronic components that operate at operating frequencies equal to or higher than 100 MHz are defined as high-frequency electronic components in the explanation of the embodiment, the high-frequency electronic components may operate at other frequencies.

Figure 5:
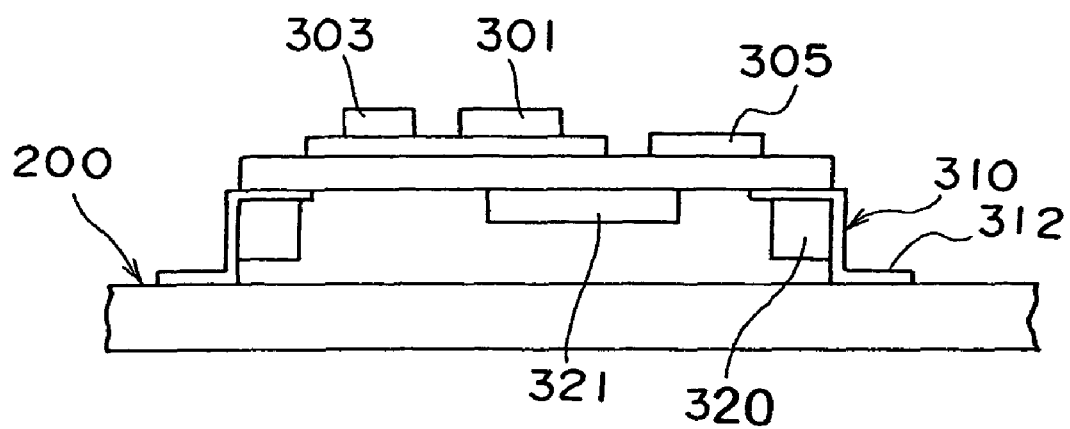
FIG. 5 is a sectional view taken a long line V-V in FIG. 3.

As shown in FIG. 5, a specific clearance (space) is formed by the connector terminals 310 between the rear surface of the multilayer module board 300 and the base board 200. By effectively utilizing this space, a plurality of electronic components 320, 321, ... can be mounted at the bottom layer (rear surface) of the multilayer module board 300.

Figure 6:
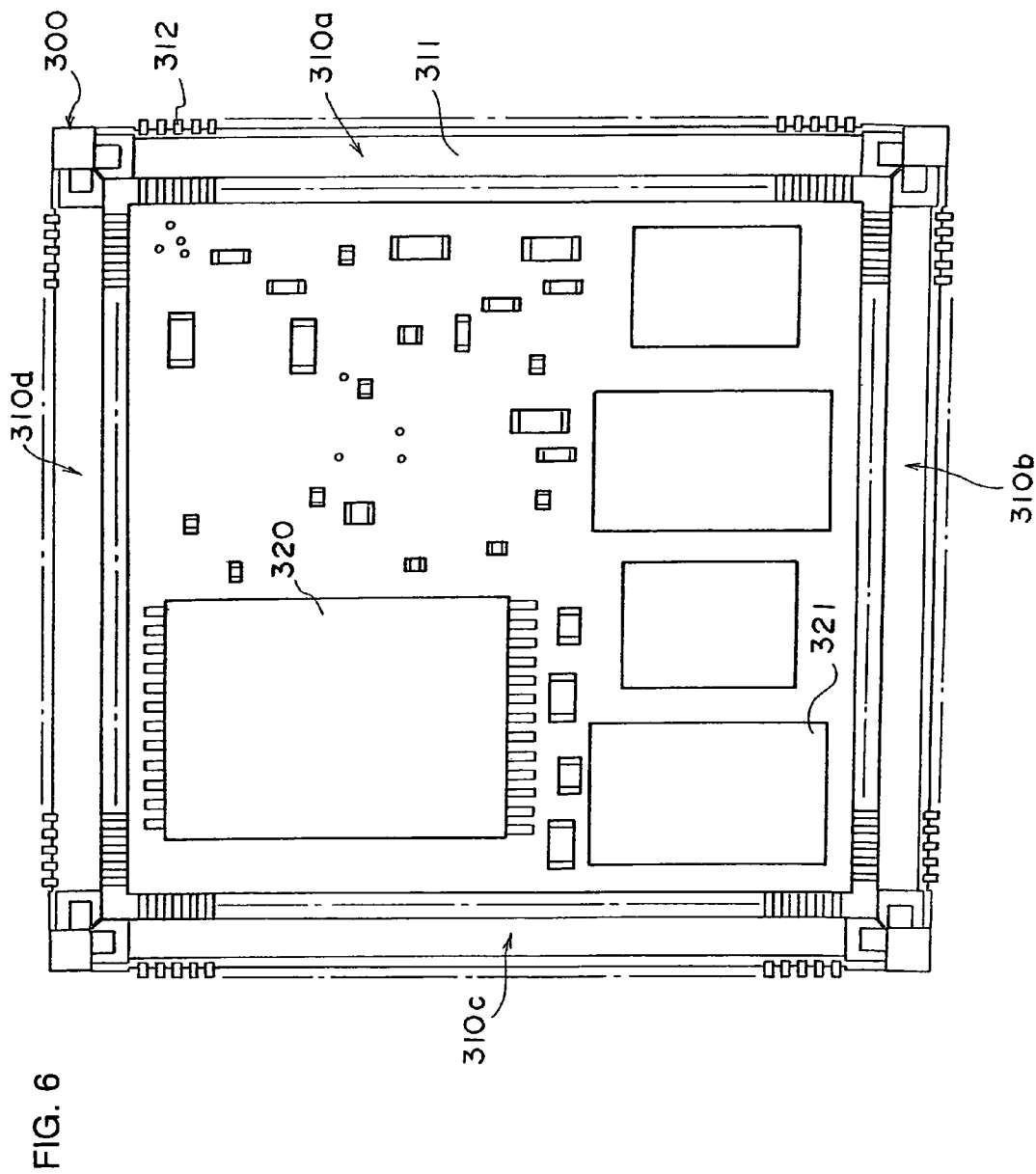
FIG. 6 shows the rear surface of the multilayer module board in FIG. 2.
Figure 7:
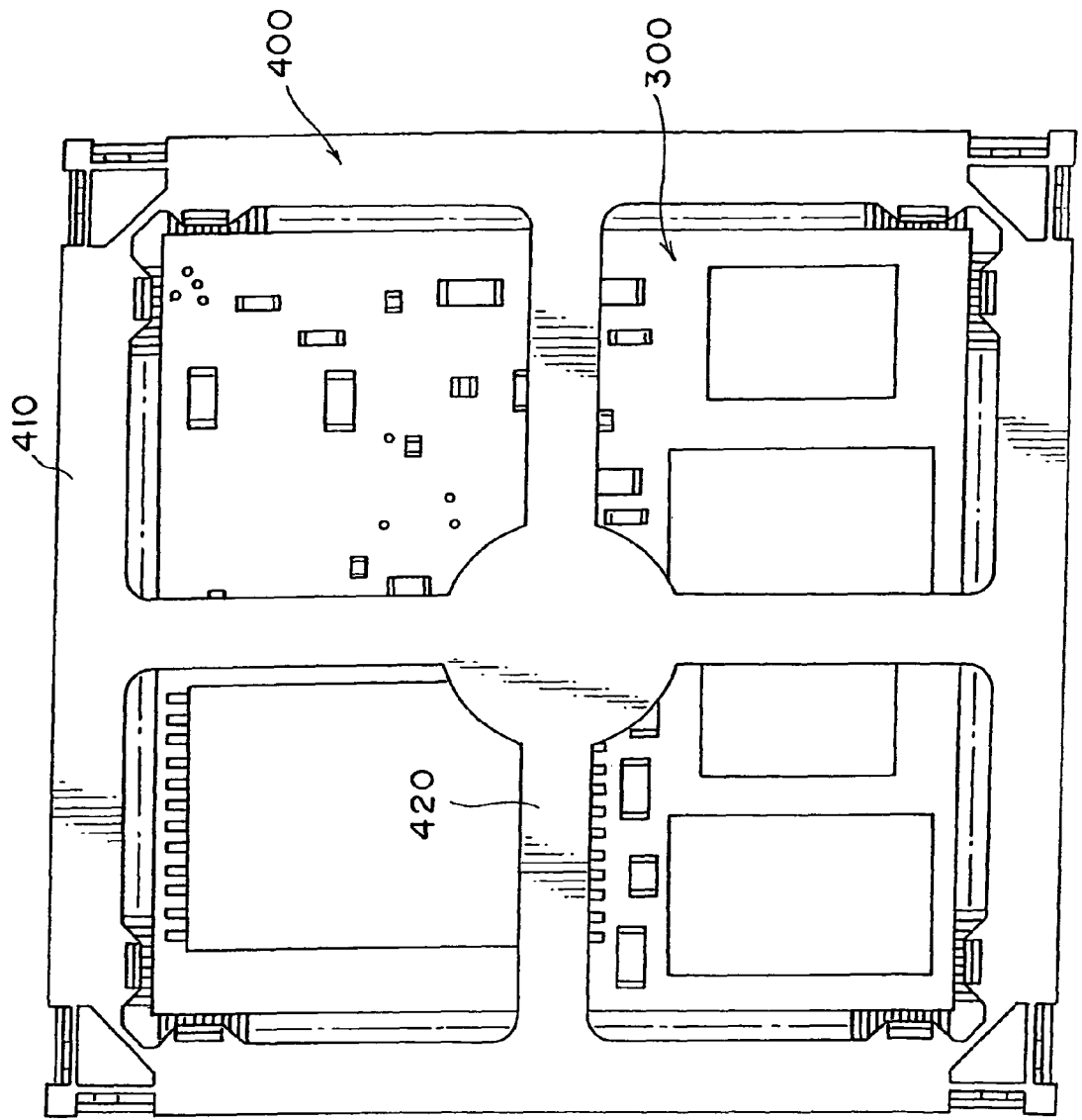
FIG. 7 shows the transfer adapter attached to the rear surface of the multilayer module board in FIG. 2.

FIG. 6 is a bottom view of the multilayer module board 300. As shown in FIG. 6, connector terminals 310a to 310d (they may be collectively referred to by using reference numeral 310) are each connected through soldering to one of the four sides at the rear surface of the multilayer module board 300. In this embodiment, the connector terminals 310a to 310d are attached to a transfer adapter 400, as shown in FIG. 7, the multilayer module board 300 is handled by vacuum holding the transfer adapter 400 with a handling device, and the multilayer module board 300 is then soldered onto the base board 200. The transfer adapter 400 is also used when connecting through soldering the connector terminals 310a to 310d to the multilayer module board 300 to improve the ease of the soldering operation. The transfer adapter 400 is to be detailed later.

Figure 8:
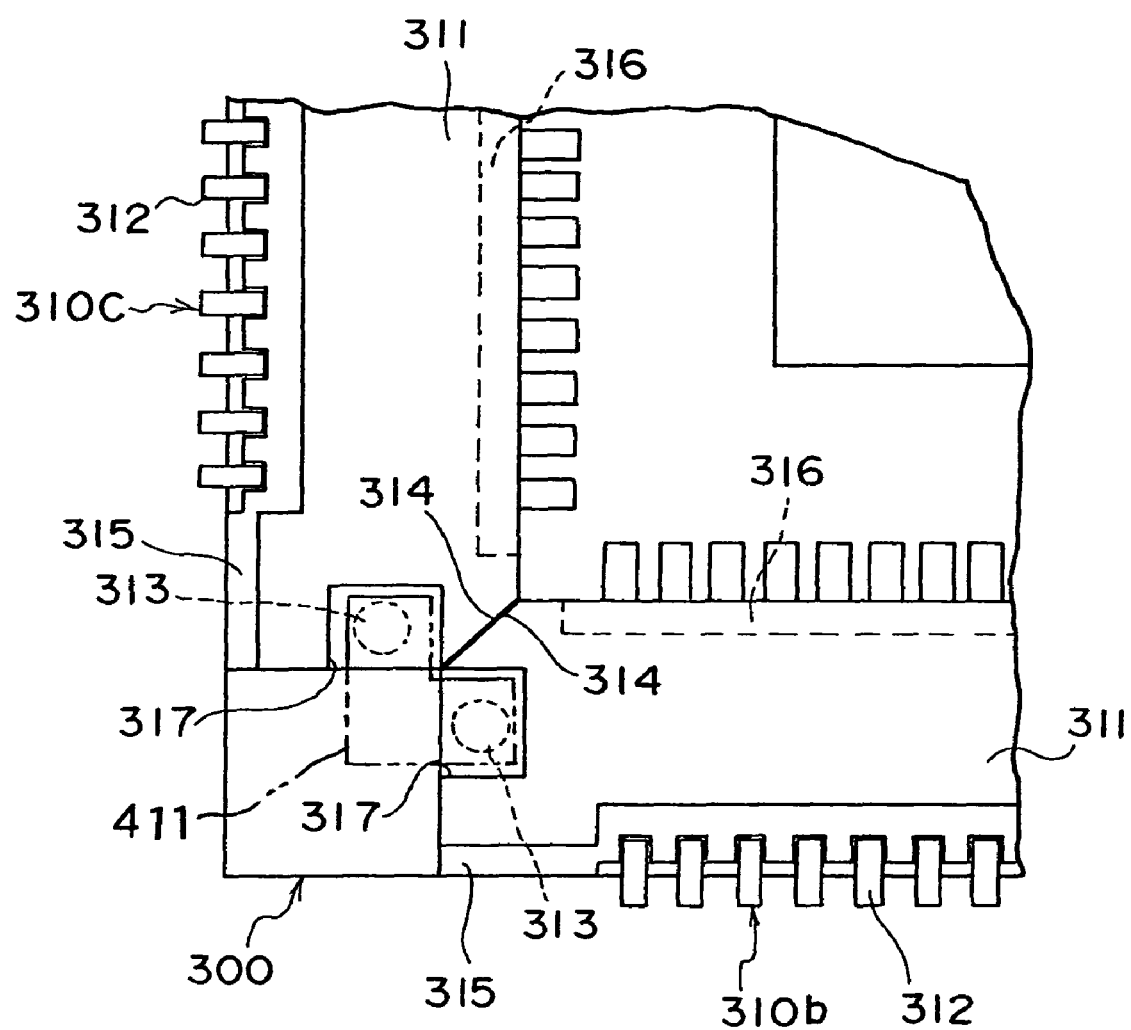
FIG. 8 shows in an enlargement an essential portion of a corner area at the rear surface of the multilayer module board in FIG. 2.

In reference to FIG. 6 and to FIG. 8, which shows in detail a corner of the rear surface of the multilayer module board 300, the connector terminals 310 are explained. The four connector terminals 310 each include a narrow, elongated base portion 311 constituted of resin, a plurality of pins 312 fixed onto the base portion 311, aligning pins 313 (see FIG. 11) each projecting at the front surface of the base portion 311 at one of the two ends thereof, i.e., on the reverse side of the view shown in FIG. 8, to be used when soldering the connector terminal onto the rear surface of the board, inclined surfaces 314 for position control each formed at one of the two ends of the base portion 311 to be used when connecting the connector terminal through soldering, fitting connection portions 315 and 316 each located at one of the two ends of the base portion 311 to connect with the transfer adapter 400 and connecting grooves 317 at which positioning projections 411 (see FIG. 9) of the transfer adapter 400 are inserted.

Figure 9:
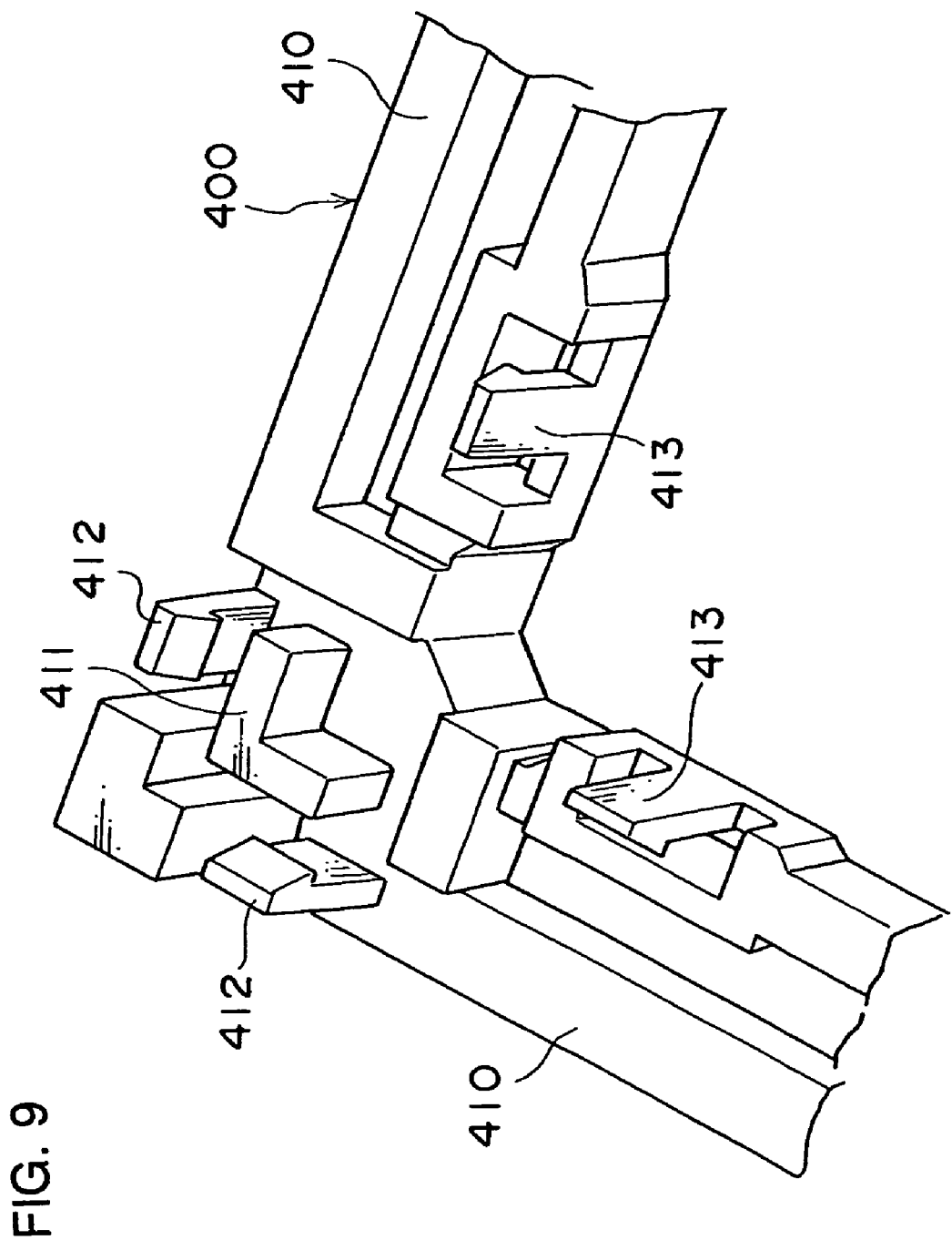
FIG. 9 is a perspective showing the transfer adapter mounted at the circuit board device in FIG. 2.

As shown in FIG. 7, the transfer adapter 400 includes an outer perimeter portion 410 substantially assuming the shape of a closed rectangle and a cross portion assuming a cross shape that connects the sides of the outer perimeter portion 410 to one another. FIG. 9 is a perspective of a corner area of the transfer adapter 400. As shown in FIG. 9, at a corner of the outer perimeter portion 410, a projection 411 that is inserted in connecting grooves 317 of connector terminals 310, outer connection claws 412 which connect with the fitting connection portion 315 of a connector terminal 310 and inner connection claws 413 which connect with the fitting connection portion 316 of a connector terminal 310 are provided.

At each of the four corners of the multilayer module board 300, a pair of positioning holes 306 at which the aligning pins 313 of the multilayer module board 300 are loosely fitted are formed.

Figure 10:
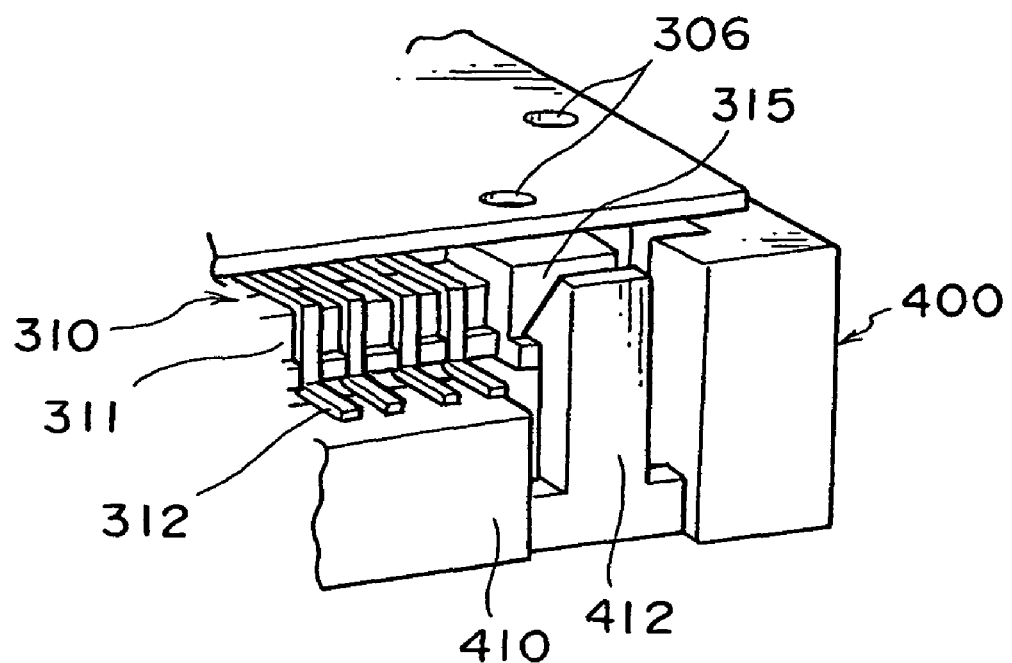
FIG. 10 is a perspective showing in an enlargement an essential portion of a corner area of the transfer adapter.

As shown in FIG. 10, as the fitting connection claws 412 (413) at the transfer adapter 400 become engaged with the fitting connecting portions 315 (316), the four connector terminals 310 each become snapped onto the transfer adapter 400. While the widthwise movement of the connector terminals 310 having become snapped onto the transfer adapter 400 is restricted inside the transfer adapter 400, they are held with a degree of freedom of movement along other directions. The transfer adapter 400 is handled with a transfer device, the transfer adapter 400 is positioned in this state onto the rear surface of the multilayer module board 300 and the connector terminals 310 are then soldered onto the multilayer module board 300.

Figure 11:
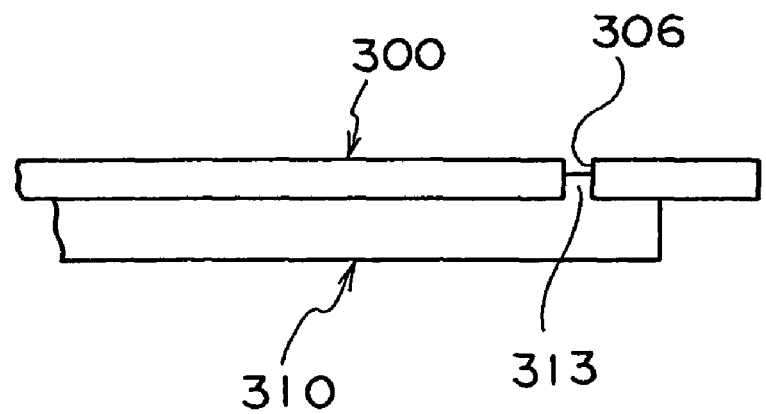
FIG. 11 is a sectional view of the structure adopted to position the connector terminals and the multilayer module board relative to each other.

The aligning pins 313 in the connector terminals 310 are designed so as to have a predetermined degree of play relative to the positioning holes 306 at the multilayer module board 300. Thus, by manipulating the transfer adapter 400, the aligning pins 313 of the connector terminals 310 are fitted into the positioning holes 306 at the multilayer module board 300, as shown in FIG. 11. The connector terminals 310 are soldered onto the multilayer module board 300 in this state. Since the pins 313 are fitted in the holes 306 with play, the connector terminals 310 attached to the transfer adapter 400 may still move inside the transfer adapter 400. However, the positions of the connector terminals 310 are controlled in the embodiment as the position control inclined surfaces 314 of, for instance, the adjacent connector terminals 310b and 310c come into contact with each other, as shown in FIG. 8. As a result, the connector terminals 310 are positioned at the individual sides of the module board 300 within an allowable range and the connector terminals 310 are connected through soldering onto the multilayer module board 300 via the pins 312 in this state.

As shown in FIG. 7 referred to earlier, such a module board 300 is connected through soldering onto the base board 200 together with other electronic components by vacuum holding the transfer adapter 400 attached to the connector terminals 310a to 310d with the handling device.

The following advantages are achieved by using the circuit board device described above.

(1) Navigation systems with various functions can be manufactured simply by using interchangeable multilayer module boards 300. For instance, a high-speed module board, an advanced function module board, a low-end module board, a multimedia module board and the like may each be designed and manufactured to be utilized as a multilayer module board 300, so as to achieve circuit board devices for navigation systems conforming to different sets of specifications with ease at a low production costs simply by mounting specific types of multilayer module boards 300 selected for specific purposes at the base board 200. Namely, it becomes no longer necessary to design and manufacture the entire circuit board device for each set of specifications.

It is to be noted that the high-speed module board is a circuit board for a high-end navigation system that operates at higher speed rather than a navigation system conforming to low-end specifications. The advanced function module board is a circuit board for a high-end navigation system having more functions than a navigation system conforming to low-end specifications. The low-end module board is a circuit board for a less expensive navigation system conforming to lower-end specifications rather than a high-end navigation system. The multimedia module board is a circuit board for a navigation system having a function of reproducing various types of data such as music and images in addition to a navigation function.

(2) The multilayer module board 300 is connected to the base board 200 by soldering the connector terminals 310 disposed at its peripheral edges to junction portions formed on the base board 200. Thus, compared to a connecting structure achieved by using mechanical connectors, a more reliable structure which is less prone to contact failure caused by vibration is achieved.

(3) Additional electronic components can be mounted at the rear surface of the multilayer module board 300 by effectively utilizing the space formed by the connector terminals 310 between the base board 200 and the multilayer module board 300. This improves the mounting efficiency and the circuit board device can be provided as a more compact unit.

(4) High-frequency electronic components are connected with one another through wiring patterns formed at inner layers of the multi-chip module and the multilayer module board. Since this reduces the length of the wiring, the extent of signal delay can be minimized and, at the same time, the occurrence of noise can be minimized, as well.

(5) Low-frequency electronic components are mounted at the base board 200, whereas high-frequency electronic components are mounted at the multilayer module board 300. This facilitates the implementation of EMI measures since the EMI measures only need to be taken at the multilayer module board 300.

(6) The four connector terminals 310 provided as separate members, which are mounted at the transfer adapter 400, are soldered onto the board 300. As a result, the ease of operation such as positioning while the connector terminals 310 are bonded onto the board 300 improves.

(7) When soldering the four connector terminals 310, the positions of the connector terminals 310 are controlled by placing the position control inclined surfaces 314 of the adjacent connector terminals 310 in contact with each other while the aligning pins 313 of the connector terminals 310 are loosely fitted at the positioning holes 306 of the multilayer module board 300. As a result, the connector terminals 310 are positioned with a high degree of reliability.

(8) Since the module board 300 is connected to the base board 200 through soldering together with other electronic components, the number of module assembly steps does not need to increase.

INDUSTRIAL APPLICABILITY

While an explanation is given above in reference to the embodiment on an example in which the present invention is adopted in a circuit board device for an on-vehicle navigation system, the circuit board device according to the present invention may be adopted in conjunction with a portable navigation system or any other type of information apparatus. In addition, the embodiment explained above simply represents an example and the present invention may be adopted in a circuit board device achieved in any of various modes without being subject to any restrictions set forth in the embodiment. For instance, the use of a transfer adapter, connector terminals or a multi-chip module is not essential to the implementation of the invention. The types of low-frequency electronic components and high-frequency electronic components, too, are not limited to those used in the embodiment.

The invention claimed is:

1. A circuit board device for an information apparatus comprising:
    a base board having mounted thereupon a plurality of low-frequency electronic components; and
    a multilayer module board mounted at one surface of the base board and having mounted thereupon a plurality of high-frequency electronic components including at least a CPU and a memory, wherein:
    the multilayer module board is one of (i) a low-end module board, (ii) a high-speed module board that operates at higher speed than the low-end module board or (iii) an advanced function module board having more functions than the low-end module board; and
    the base board is configured to accept interchangeably a connection with a multilayer board that is (i) the low-end module board, (ii) the high-speed module board and (iii) the advanced function module board,
    the plurality of high-frequency electronic components including a CPU and a memory mounted at, at least, a surface thereof,
    the plurality of high-frequency electronic components are connected with one another through a wiring patterns formed at an inner layer thereof, and
    an overall shape of the multilayer module board is rectangular and the multilayer module board comprises four connector terminals provided as separate members each soldered onto one of four peripheral edges thereof.

2. A navigation system comprising a circuit board device for an information apparatus according to claim 1.

3. The multilayer module board according to claim 1, wherein:
    the four connector terminals each include a narrow, elongated base portion constituted of resin and a plurality of pins fixed to the base portion; and
    the four connector terminals are each carried with the base portion attached to a transfer adapter and the four connector terminals are connected through soldering onto a rear surface of the board while attached to the transfer adapter.

4. The multilayer module board according to claim 1, wherein:
    the four connector terminals each include
        a narrow, elongated base portion constituted of resin;
        a plurality of pins fixed to the base portion;
        aligning pins projecting at both ends of the base portion to be used when soldering the connector terminal onto a rear surface of the board; and
        inclined surfaces for position control formed at both ends of the base portion to be used when soldering the connector terminal;
    a pair of positioning holes at which the aligning pins are loosely fitted are formed at each of four corners of the board; and
    positions of the connector terminals are controlled when soldering the connector terminals as the inclined surfaces for position control at adjacent connector terminals come into contact with each other while the aligning pins are loosely fitted at the positioning holes.

5. A circuit board device, comprising:
    a base board; and
    a multilayer module board mounted on the base board, the multilayer module board comprising:
        a plurality of high-frequency electronic components including a CPU and a memory mounted at, at least, a surface thereof, wherein:
        the plurality of high-frequency electronic components are connected with one another through a wiring pattern formed at an inner layer thereof;
        an overall shape of the multilayer module board is rectangular and the multilayer module board comprises four connector terminals provided as separate members each soldered onto one of four peripheral edges thereof;

the four connector terminals each include a narrow, elongated base portion constituted of resin and a plurality of pins fixed to the base portion; and after the four connector terminals are each carried with the base portion attached to a transfer adapter, the four connector terminals are connected through soldering onto a rear surface of the board while attached to the transfer adapter.

6. A circuit board device, comprising:

a base board; and a multilayer module board mounted on the base board, the multilayer module board comprising:

a plurality of high-frequency electronic components including a CPU and a memory mounted at, at least, one surface thereof, wherein:

the plurality of high-frequency electronic components are connected with one another through a wiring pattern formed at an inner layer thereof;

an overall shape of the multilayer module board is rectangular and the multilayer module board comprises four connector terminals provided as separate members each soldered onto one of four peripheral edges thereof;

the four connector terminals each include
a narrow, elongated base portion constituted of resin;
a plurality of pins fixed to the base portion;
aligning pins projecting at both ends of the base portion to be used when soldering the connector terminal onto a rear surface of the board; and
inclined surfaces for position control formed at both ends of the base portion to be used when soldering the connector terminal;

a pair of positioning holes at which the aligning pins are loosely fitted are formed at each of four corners of the board; and positions of the connector terminals are controlled when soldering the connector terminals as the inclined surfaces for position control at adjacent connector terminals come into contact with each other while the positioning pins are loosely fitted at the positioning holes.

* * * * *